United States Patent [19]

Gray

[11] Patent Number: 5,030,895

[45] Date of Patent: Jul. 9, 1991

[54] FIELD EMITTER ARRAY COMPARATOR

[75] Inventor: Henry F. Gray, Alexandria, Va.

[73] Assignee: The United States of America as represented by the Secretary of the Navy, Washington, D.C.

[21] Appl. No.: 574,858

[22] Filed: Aug. 30, 1990

[51] Int. Cl.⁵ .............................................. H03K 5/22
[52] U.S. Cl. ................................... 315/350; 213/309; 213/336; 328/146
[58] Field of Search ............... 315/350; 313/309, 336, 313/351; 328/146, 148

[56] References Cited

U.S. PATENT DOCUMENTS

| | | | |
|---|---|---|---|
| 3,635,157 | 1/1972 | Taylor et al. | 313/309 |
| 3,665,325 | 5/1972 | Takeda et al. | 328/146 |
| 3,755,704 | 8/1973 | Spindt et al. | 313/336 |
| 3,882,405 | 5/1975 | Tajima et al. | 328/146 |
| 4,061,932 | 12/1977 | Cordell | 328/146 |
| 4,147,943 | 4/1979 | Peterson | 328/146 |
| 4,219,152 | 8/1980 | Couch et al. | 328/146 |
| 4,307,507 | 12/1981 | Gray et al. | 313/309 |
| 4,345,181 | 8/1982 | Shelton | 313/309 |
| 4,420,743 | 12/1983 | Upadhyayula | 307/304 |
| 4,827,177 | 5/1989 | Lee et al. | 313/336 |

Primary Examiner—Eugene R. Laroche
Assistant Examiner—Son Dinh
Attorney, Agent, or Firm—Thomas E. McDonnell; George Jameson

[57] ABSTRACT

A field emitter array comparator is provided wherein voltage or current input signals supplied to at least two deflectors control the selective deflection of a beam of electrons to one collector of a collector array of at least two collectors. The beam of electrons is generated by a source of electrons, such as a field emitter array, in an evacuated chamber, and the at least two deflectors are disposed in preselected positions relative to the electron source. The input signals to the at least two deflectors cause deflection of the beam of electrons in the direction of the deflector to which the most positive signal is applied, thus causing the electron beam to strike a collector positioned in the path of the deflected beam. This results in a reduction in voltage associated with that collector. In general, the voltages on the collectors are used to determine whether the signal inputs are equal or, if unequal, which input has the greastest magnitude.

10 Claims, 2 Drawing Sheets

FIELD EMITTER ARRAY COMPARATOR

FIELD OF THE INVENTION

This invention relates generally to voltage and current comparators and more specifically, to an improved comparator for analog or digital signals employing field emitter array technology.

BACKGROUND OF THE INVENTION

Analog and digital comparators conventionally are comprised of semiconductor devices and in particular, comparator devices having a minimum of two transistors. The speed of such semiconductor comparators is limited by the switching time of the transistors which is, in turn, determined by the maximum charge carrier velocity in the semiconductor. In addition, in some applications where a large number of comparators are required, the actual total current in the final circuit limits both the switching speed and the size and complexity of the circuit because of the total inductance of the circuit. That is because of finite inductance only a few comparators can be switched on and off rapidly. Other drawbacks of such comparators include a sensitivity to temperature and radiation.

SUMMARY OF THE INVENTION

Generally speaking, the present invention concerns a comparator or comparator system which uses vacuum devices. Such vacuum devices have the advantage of functioning at speeds greater than those of semiconductor devices, are intrinsically radiation hard because the normal damage mechanisms associated with semiconductors are eliminated, and have a temperature range of operation which far exceeds that of typical semiconductor comparator devices.

In accordance with a preferred embodiment of the invention, a comparator is provided which uses a Field Emitter Array (FEA) to provide a controlled electron source. A FEA typically comprises an array of conical, pyramidal or cusp-shaped point, edge, or wedge-shaped structures which are electrically insulated from a positively charged extraction gate and which produces an electron beam that travels through an associated opening in the charged gate thereabove. Such FEA devices have been used in the past for high speed current switching. Patents relating to this technology include U.S. Pat. Nos. 4,827,177; 4,721,885; 4,578,614; 4,307,507; and 3,755,704.

According to one embodiment of the invention, a single cell FEA is used to provide a signal comparator which has the advantage of being very fast, radiation hard, and substantially insensitive to temperature.

In the preferred embodiment of the invention referred to above, the comparator basically comprises an electron emissive substrate which generates a beam of electrons within an evacuated enclosure, a collector assembly comprising at least two collectors, and a deflector means for providing selective deflection of the electron beam to one of the collectors of the collector assembly. The deflector means comprises a pair of deflectors mounted on opposite sides of the beam of electrons between the substrate and the collector assembly and sets up an electric field between the deflectors having a potential difference that modifies the trajectory of the beam of electrons based on signal inputs to the deflectors. By controlling these inputs, the beam of electrons can be selectably deflected to one collector of the collector assembly. This results in a reduction of voltage associated with that collector and this reduction in voltage is ultimately used to determine whether the signal inputs are equal or if unequal, which input has the greatest magnitude.

The comparator device of the invention preferably comprises a vacuum integrated-circuit type device made using VMOS and planar semiconductor device processing technology. The use of a vacuum rather than a solid state medium, e.g. silicon, gallium arsenide, or the like, provides a number of advantages as mentioned above. In particular, the charge carrier speed of a semiconductor device is limited by electron velocity saturation to about 2 to $5 \times 10^7$ cm/sec., whereas the electron speed in vacuum is ultimately limited to $3 \times 10^{10}$ cm/s, i.e., the speed of light. Further, heat dissipation considerations limit the achievable packing density of semiconductor integrated circuits because of carrier generation ($\sim 250°$ C. for silicon), whereas a vacuum device is thermally insensitive. Further, a vacuum device also provides the advantage of being free of permanent radiation effects (upsets and soft errors) resulting from collection of electron-hole pairs produced by the passage of fast ions, X-rays or gamma rays.

Other features and advantages of the invention will be set forth in, or apparent from, the following detailed description of preferred embodiments of the invention.

DESCRIPTION OF THE PREFERRED EMBODIMENTS

Figure 1:
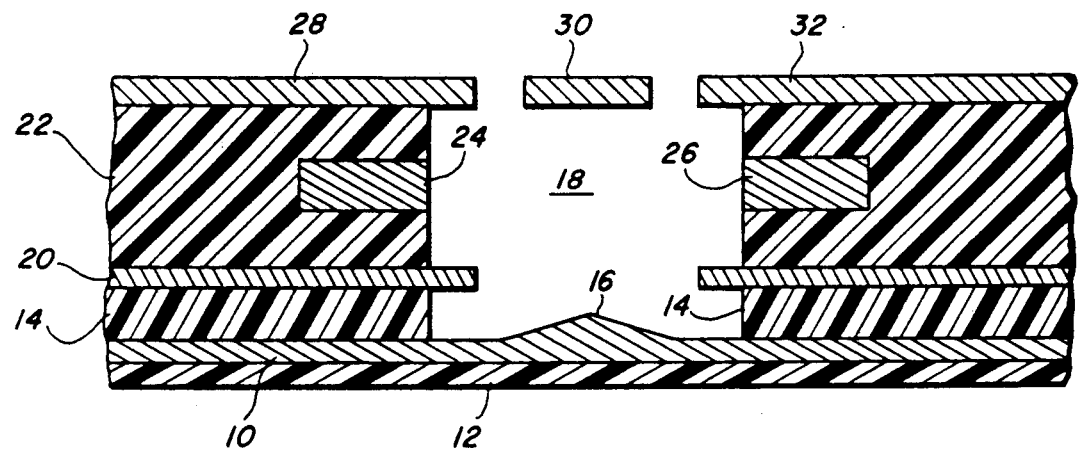
FIG. 1 is a transverse cross section of a preferred embodiment of the comparator of the invention.

Referring to FIG. 1, an ultra-fast analog/digital comparator constructed in accordance with a preferred embodiment of invention includes an electron-emissive conductive substrate 10 which is made of a material such as silicon and is disposed between a pair of insulative layers 12 and 14 of material such as $SiO_2$, $Al_2O_2$, or $Si_3N_4$ or other insulator known in the art. At least one field emission cathode or field emitter 16 is provided in an opening formed in the insulative layer 14 and is comprised of a conical, pyramidal or cusp-like point, edge or wedge-shaped structure extending upwardly from conductive substrate 10. The field emitter 16 is laterally symmetrical with respect to the axis of an evacuated chamber 18, as shown. The field emitter 16 can be formed by several well known processes. One such process is the orientation dependant etching technique disclosed in U.S. Pat. No. 4,307,507, the disclosure of which is hereby incorporated by reference. A conductor or conductive layer 20, preferably in the form of an extraction electrode, is disposed above insulative layer 14. Conductive layer 20 can be composed of a substance like polysilicon or any other conductive material known in the art. The field emitter array construction so far described is conventional and is similar to that disclosed in U.S. Pat. Nos. 4,827,177; 4,578,614; and 3,755,704.

An insulative layer 22 disposed above conductive layer 20 is provided to hold a deflector assembly comprising first and second deflectors 24 and 26 above and insulated from the conductive layer 20 therebelow. This insulative layer 22 is fabricated from a material such as $SiO_2$, $Al_2O_2$, $Si_3N_4$ or another suitable insulator. The deflectors 24 and 26 are preferably composed of a conductive (metallic) material. It is noted that the number of deflectors in the array corresponds to the number of input voltage or current signals. In the embodiment of FIG. 1 two voltages are being compared and these voltages are applied to deflector 24 and deflector 26, respectively. In other words, deflector 24 has a voltage thereon corresponding to one of the two input voltages and deflector 26 has a voltage thereon corresponding to the other input voltage.

The insulative layer 22 also insulates from the deflectors 24 and 26 a collector assembly comprised of first collector 28, a second central collector 30, and a third collector 32. Although three collectors are used in the illustrated embodiment, a greater or lesser number can be employed. The collectors 28, 30, and 32 are composed of a conductive material and the collector assembly is used for recovering the electrons ejected or emitted from the field emitter 16.

Figure 2:
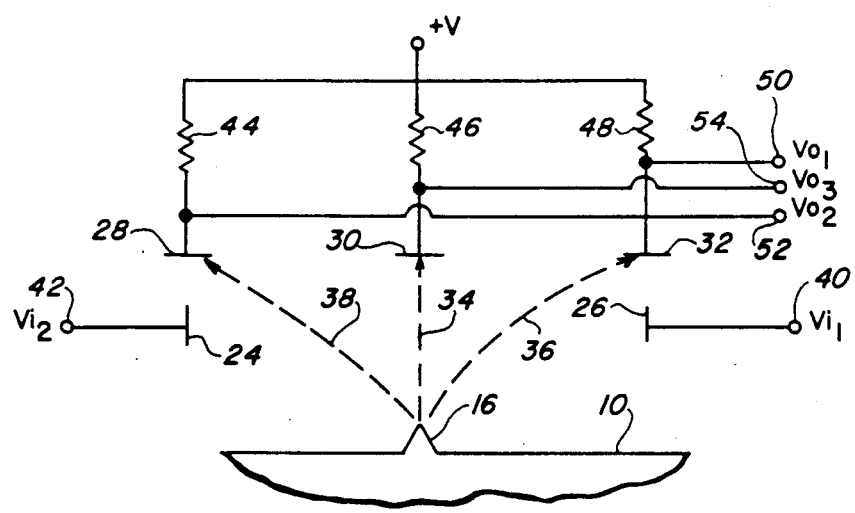
FIG. 2 is a schematic diagram of the comparator of FIG. 1, illustrating three different modes of operation.

FIG. 2 is a schematic diagram of a circuit which uses the device of FIG. 1 and illustrates three possible modes of operation. For the sake of clarity and ease of understanding, conductive layer 20 and insulation layers 14 and 22 have been omitted in FIG. 2. In addition, although not shown in FIG. 2, the potential difference between the extraction electrode (conductive layer 20 in FIG. 1) and emitter 16 can be an exemplary +10 volts, and the potential difference between each of the collectors 28, 30 and 32 and the emitter 16 can be an exemplary +20 volts. A first input voltage $Vi_1$ is applied to a first input terminal 40 connected to deflector 26 while a second input voltage $Vi_2$ is applied to a second input terminal 42 connected to deflector 24. First, second, and third resistors 44, 46, and 48 are respectively connected to collectors 28, 30, and 32 and are used to measure the voltage drops associated with the collector currents in these collector circuits. Output terminals 50, 52, and 54 are respectively connected to the junctions between resistor 48 and collector 32, resistor 44 and collector 28, and resistor 46 and collector 30, and the output voltages at these terminals are denoted $Vo_1$, $Vo_2$, and $Vo_3$, respectively, as shown.

Considering the operation of the device of FIG. 2, if the input voltage $Vi_1$ is more positive than input voltage $Vi_2$, reflecting what would be considered to be a first mode of operation, there will be a potential difference between deflector 26 and deflector 24 which will cause the electron beam emitted from the field emitter 16 to be deflected in the direction of deflector 26, as is indicated by electron beam 36, thereby resulting in the majority of electrons of the electron beam 36 striking collector 32.

Figure 3A:
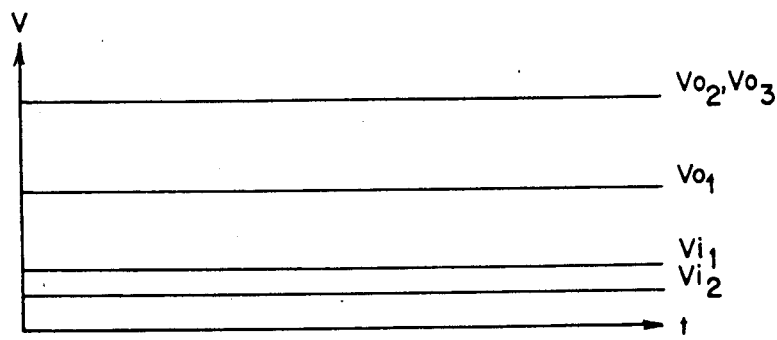
FIGS. 3(a), 3(b), and 3(c) are graphs representing the input and output voltages for the three modes of operation illustrated in FIG. 2.

FIG. 3(a) represents the input voltages at deflectors 24 and 26 and the output voltages at the collectors 28, 30, and 32 for this first mode of operation, i.e., when the input voltage $Vi_1$ is more positive than input voltage $Vi_2$. As can be seen from FIG. 3(a), the output voltage at collector 32, i.e., voltage $Vo_1$, is less positive than the output voltages of collectors 28 and 30, i.e., voltages $Vo_2$ and $Vo_3$ respectively. The voltage levels $Vo_2$ and $Vo_3$ are determined by the voltages at the collectors 28 and 30 and will have the value of the applied bias voltage (+V).

If the input voltage $Vi_1$ is less positive than input voltage $Vi_2$, reflecting a second mode of operation, there will be a potential difference between deflector 26 and deflector 24 which will cause the negatively charged electron beam emitted from the field emitter 16, as is indicated by electron beam 38, to be deflected in the direction of deflector 24, thus resulting in the majority of electrons striking collector 28.

Figure 3B:
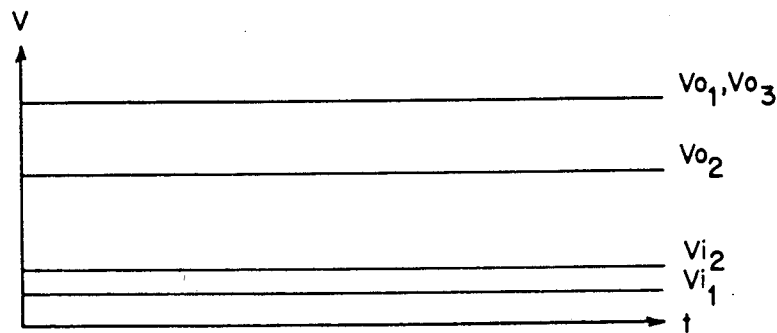

FIG. 3(b) represents the input voltages at deflectors 24 and 26 and the output voltages at the collectors 28, 30, and 32 for this second mode of operation, i.e., when the input voltage $Vi_1$ is less positive than input voltage $Vi_2$. As can be seen, the output voltage at collector 28, i.e., $Vo_2$, is less positive than the output voltages of collectors 30 and 32, i.e., voltages $Vo_3$ and $Vo_1$ respectively. As before, the voltage levels of $Vo_1$ and $Vo_3$ are determined by the voltages at the electrodes 30 and 32 and will have the same value, namely the value of the bias voltage +V.

If the input voltage $Vi_1$ is equal to input voltage $Vi_2$, reflecting a third mode of operation, there will be no potential difference between deflector 26 and deflector 24 and this will cause the negatively charged electron beam emitted from the field emitter 16 to have its trajectory undisturbed, as is indicated by electron beam 34, thus resulting in the majority of electrons striking collector 30.

Figure 3C:
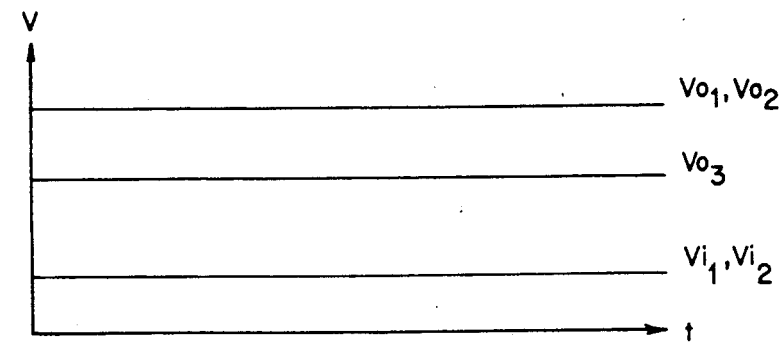

FIG. 3(c) represents the input voltages to deflectors 24 and 26 and the output voltages at the collectors 28, 30, and 32 for this third mode of operation, i.e., when the input voltage $Vi_1$ is equal to input voltage $Vi_2$. As can be seen, the output voltage of collector 30, i.e., $Vo_3$, is lower than the output voltages of collectors 28 and 32, i.e., $Vo_2$ and $Vo_1$ respectively. The voltage levels of $Vo_1$ and $Vo_2$ are determined by the voltages at the collectors 28 and 32 and will have the same value, namely the value of the bias voltage +V.

As noted above, the device of FIG. 1 can be fabricated in a variety of ways. For example, the device can be made entirely using thin film technology such as described in U.S. patent application Ser. No. 07/535,612, filed Jun. 6, 1990. Further, as mentioned for some of the conductors described above, the conductors used can be fabricated from a variety of materials and can be metals, semi-metals, semiconductors, conducting polymers, high temperature superconductors and the like. Further, the electron source or sources used need not be restricted to field emitter arrays and the source used can be thermionic integrated circuit structures, cesiated semiconductor biased P-N junction devices, negative electron affinity electron sources, and the like, which can be incorporated into a fully integrated microminiature cell. However, only a field emitter array cell such as described above in connection with the preferred embodiment has all of the advantages described above and thus the use of such a cell is preferred.

Although the present invention has been described relative to specific exemplary embodiments thereof, it will be understood by those skilled in the art that variations and modifications can be effected within the purview of the claimed invention. For example, the device shown in FIGS. 1 and 2 could be modified to include 3 or more deflectors and 4 or more collectors to provide more extensive logic functions. Furthermore, the comparator of the invention could utilize a plurality of emitters in a plurality of associated apertures as the electron source associated with a particular deflector and collector system. It is therefore to be understood that, within the scope of the appended claims, the invention may be practiced otherwise than as specifically described.

What is claimed is:

1. A field emitter array comparator for comparing input signals thereto, said comparator comprising:
   means defining an evacuated chamber;
   an electron source for introducing a deflectable beam of electrons within said evacuated chamber;
   a collector array comprising at least two spaced collectors for selectively receiving electrons from said source; and
   deflector means comprising at least two deflectors which are positioned in predetermined positions relative to the source of said beam of electrons and to which input signals to be compared are respectively applied for deflecting said beam to one collector of said at least two collectors as a function of the relationship of said input signals to each other.

2. The comparator as claimed in claim 1 wherein said electron source comprises an electron emissive substrate.

3. The comparator as claimed in claim 2 wherein said substrate includes at least one emitter selected from the group consisting of conical-shaped, pyramidal-shaped, cusp-shaped, edge-shaped, point-shaped and wedge-shaped emitters.

4. The comparator as claimed in claim 1 wherein said source comprises a field emitter array.

5. The comparator as claimed in claim 1 wherein said collectors comprise at least two collectors.

6. The comparator as claimed in claim 1 wherein said collectors include a central collector and at least two further collectors disposed in predetermined positions relative to said central collector.

7. The comparator as claimed in claim 1 wherein said deflectors comprise first and second conductive deflector layers and said comparator further comprises an insulative layer for insulating said conductive deflector layers from said collectors and for insulating said conductive deflector layers from said electron source.

8. The comparator as claimed in claim 1 further comprising an output circuit connected to said collector array and including an associated voltage dropping resistor connected to each of said collectors.

9. An ultra-fast signal comparator comprising:
   an electron emissive substrate;
   a first insulating layer to form an aperture in the top central region of said electron emissive substrate;
   an evacuated region partially bounded by portions of said first insulative layer defining said aperture in said first insulative layer;
   a field-emitter comprising a portion of said electron emissive substrate extending into said aperture and thus into said evacuated region;
   a conductive layer, electrically insulated from said electron emissive substrate by said first insulative layer and defining an opening that is smaller than that provided by said aperture in said first insulative layer, for inducing the emission of an electron beam from said field-emitter;
   a second insulative layer disposed above said conductive layer and bounding further portions of said evacuated region;
   a deflector means, disposed above said second insulative layer and comprising first and second deflectors located on opposite sides of said evacuated region, for selectively deflecting the electron beam emitted from said field-emitter;
   means for supplying input signals to the said deflector means to selectively cause the deflection of the electron beam emitted from said field-emitter;
   a collector means, comprising at least two collectors spaced from and insulated from said deflector means by said second insulative layer, for receiving the electron beam emitted from said field emitter; and
   means for extracting an output signal from said collector means.

10. The comparator recited in claim 9 wherein said field-emitter is selected from the group consisting of conical-shaped, pyramidal-shaped, cusp-shaped, edge-shaped, point-shaped and wedge-shaped emitters.

* * * * *